United States Patent [19]

Ikenaga et al.

[11] Patent Number: 4,878,177

[45] Date of Patent: Oct. 31, 1989

[54] METHOD FOR DRAWING A DESIRED CIRCUIT PATTERN USING CHARGED PARTICLE BEAM

[75] Inventors: Osamu Ikenaga; Susumu Watanabe, both of Kawasaki, Japan

[73] Assignee: Kabushiki Kaisha Toshiba, Kawasaki, Japan

[21] Appl. No.: 155,027

[22] Filed: Feb. 11, 1988

[30] Foreign Application Priority Data

Feb. 16, 1987 [JP] Japan .................................. 62-32718

[51] Int. Cl.⁴ ............................................ H01J 37/302
[52] U.S. Cl. .................................... 364/489; 364/490; 364/491; 250/492.2
[58] Field of Search ................................ 364/488–491; 250/396 R, 492.21, 492.22, 492.23; 378/34, 35, 113

[56] References Cited

U.S. PATENT DOCUMENTS

| | | | |
|---|---|---|---|
| 4,132,898 | 1/1979 | Buelow et al. | 250/492.22 |
| 4,467,026 | 8/1984 | Ogawa | 378/34 |
| 4,477,729 | 10/1984 | Chang et al. | 250/492.22 |
| 4,482,810 | 11/1984 | Cooke | 364/490 |
| 4,511,980 | 4/1985 | Watanabe | 250/492.22 |
| 4,532,598 | 7/1985 | Shibayama et al. | 364/491 |
| 4,586,141 | 4/1986 | Yasuda et al. | 364/490 |
| 4,607,333 | 8/1986 | Yasutake et al. | 364/490 |
| 4,636,968 | 1/1987 | Gotou et al. | 364/491 |
| 4,701,940 | 10/1987 | Soda et al. | 378/34 |
| 4,718,019 | 1/1988 | Fillion et al. | 364/490 |
| 4,723,221 | 2/1988 | Matsuura et al. | 364/490 |
| 4,728,797 | 3/1988 | Gotou et al. | 364/490 |
| 4,743,766 | 5/1988 | Nakasuji et al. | 250/492.22 |
| 4,754,408 | 6/1988 | Carpenter et al. | 364/488 |
| 4,789,945 | 12/1988 | Niijima | 364/489 |

FOREIGN PATENT DOCUMENTS

| | | |
|---|---|---|
| 57-12520 | 1/1982 | Japan . |
| 57-122525 | 7/1982 | Japan . |
| 59-119831 | 7/1984 | Japan . |
| 60-196939 | 10/1985 | Japan . |

OTHER PUBLICATIONS

"Transactions of the 1984 National Meeting of the Institute of Electronics and Communications Engineers of Japan"—Pattern Partitioning Technique for Electron Beam Drawing (Fujitsu Ltd.) Takeo Nagata et al.

Primary Examiner—Parshotam S. Lall
Assistant Examiner—Christopher L. Makay
Attorney, Agent, or Firm—Oblon, Spivak, McClelland, Maier & Neustadt

[57] ABSTRACT

There is disclosed a specific method, which is applied to a charged particle beam pattern drawing system, for drawing a circuit pattern on a workpiece using a charged particle beam. A circuit pattern to be drawn is first divided into unit figures by parallel line segments extending from the vertexes of the figure that has a polygonal planar shape in a first reference direction. Each of the unit figures corresponds to a specific reference figure registered in advance. When the divided unit figures include an elongated too-small figure having at least one side shorter than a predetermined minimum allowable length, the too-small figure is merged with at least one unit figure adjacent to it at least once, and thus an expanded unit figure is defined. The expanded unit figure is divided into new unit figures by parallel line segments extending from its vertexes in a second reference direction perpendicular to the first reference direction so as to correspond to the reference figures. As a result, remaining of the too-small figures in the circuit pattern to be actually subjected to charged particle beam pattern drawing is minimized.

7 Claims, 8 Drawing Sheets

| | |
|---|---|
| FIGURE IDENTIFICATION CODE | ~61 |
| BEAM DOSE | ~62 |
| BEAM DRAWING POSITION  xi, yi | ~63 |
| FIGURE SIZE  H  W  S1  S2 | ~64 |

F I G. 4

F I G. 5

F I G. 6

METHOD FOR DRAWING A DESIRED CIRCUIT PATTERN USING CHARGED PARTICLE BEAM

BACKGROUND OF THE INVENTION

The present invention relates to a method for drawing a desired circuit pattern using a charged particle beam and, more particularly, to a method of minimizing too-small figures remaining in integrated circuit patterns of semiconductor devices to be drawn on an object or a workpiece such as a mask and a wafer.

Recently, chip circuit patterns are increasingly micronized and complicated along with the increase in packing density of semiconductor devices such as a dynamic random access memory or a microprocessor. A charged particle beam pattern drawing system is generally used to draw circuit patterns of highly-integrated semiconductor devices on a workpiece such as a mask or a wafer. First, a chip circuit pattern is formed using a design tool such as a computer-aided design system (also known as a "CAD" system or simply referred to as "CAD"). The initially designed circuit pattern is drawn or depicted on a workpiece using the charged particle beam pattern drawing system.

Generally, graphic data of a chip circuit pattern created by a CAD system cannot be directly used as input drawing data of the charged particle beam pattern drawing system. This is because of the following facts:

(1) Unlike CAD design data which represents circuit pattern regions having various types of polygonal shapes, input graphic data of the charged particle beam pattern drawing system can only use basic rectangles having comparatively simple limited shapes such as a rectangle, a trapezoid, and a parallelogram in order to represent a circuit pattern region subjected to charged particle beam pattern drawing. Therefore, the circuit pattern must be divided into a combination of these basic rectangles.

(2) If the divided circuit patterns to be subjected to charged particle beam pattern drawing include overlapping figures, the overlapping region is excessively exposed, thus degrading the beam pattern drawing precision.

Usually, in a system or a computer for generating data for the charged particle beam pattern drawing system, when a circuit pattern to be drawn is divided into several basic rectangles (unit figures), such unit figures often include a figure having a side shorter than a length (minimum allowable length) allowable as a side of a unit figure of pattern drawing (to be referred to as a "too-small figure" hereinafter). If a too-small figure is directly drawn on a workpiece with a charged particle beam, the current density of the irradiated charged particle beam is smaller than that in other ordinary unit figures. As a result, the beam radiation amount for the too-small figure on the workpiece is insufficient to cause a defect in pattern drawing such as a pattern disconnection and/or pattern extinguishment, thus considerably degrading the quality of the resultant drawn pattern. In order to draw a pattern of a satisfactory high quality, it has been desired in this field that remaining of the too-small figures as described above be suppressed or prevented in divided unit figures of an input pattern.

SUMMARY OF THE INVENTION

It is therefore an object of the present invention to provide a new and improved method for drawing a desired pattern using a charged particle beam which can draw a desired pattern on a workpiece at a high precision.

In accordance with the above object, the present invention is addressed to a specific method, which is applied to a charged particle beam pattern drawing system and in which a circuit pattern is drawn on a workpiece using a charged particle beam. A circuit pattern to be drawn is first divided into unit figures by parallel line segments extending from the vertexes of the figure that has a polygonal planar shape in either a first or second reference direction. Each of the unit figures corresponds to a specific reference figure registered in advance. When the divided unit figures include a too-small figure having at least a side shorter than a predetermined allowable minimum length, the too-small figure is merged with at least another adjacent unit figure, and thus an expanded unit figure is defined. The expanded unit figure is divided into new unit figures by parallel line segments extending from the vertexes in the remaining one of the first and second reference directions so as to correspond to the reference figures. As a result, too-small figures remaining in the circuit pattern to be actually subjected to charged particle beam pattern drawing is minimized, and the object of the present invention can be achieved.

The present invention and its objects and advantages will become more apparent from the detailed description of its preferred embodiment presented below.

BRIEF DESCRIPTION OF THE DRAWINGS

In the detailed description of a preferred embodiment of the invention presented below, reference is made to the accompanying drawings of which.

DETAILED DESCRIPTION OF THE PREFERRED EMBODIMENT

Prior to explanation of the method for drawing a desired circuit pattern using a charged particle beam of the present invention, a conventional pattern drawing method will be described with reference to FIGS. 1A to 1D, in order to facilitate understanding of the present invention. CAD design data must be converted into graphic data which can be actually processed by a used charged particle beam pattern drawing system such as an electron beam pattern drawing system, before a pattern to be drawn which is represented by input graphic data, e.g., an integrated circuit pattern of an LSI, is actually drawn on a workpiece such as a mask or wafer by using a charged particle beam pattern drawing technique. In data conversion, the initial circuit pattern region of the CAD design data is divided into several unit figures in a known manner described in the introductory part of the present application. The respective divided unit figures correspond to basic figures registered in advance.

Figure 1A:
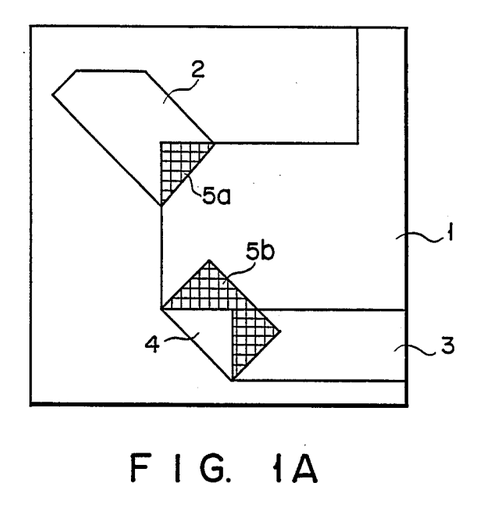
FIGS. 1A to 1D are diagrams schematically showing representative examples of region patterns sequentially created in the process of dividing an input drawing pattern to be drawn into several pattern drawing unit figures.

In the example shown in FIG. 1A, four polygons, i.e., "L"-shaped FIG. 1, pseudo-trapezoid 2, and rectangles 3 and 4 are input as CAD pattern design data. These figures partially overlap each other: FIG. 2 overlaps FIG. 1 in triangular region 5a, and FIG. 4 overlaps FIGS. 1 and 3 in "C"-shaped region 5b. These overlapping regions 5a and 5b are cross-hatched only for the sake of clarity. The combination of FIGS. 1 to 4 is then subjected to known contour extraction; overlapping regions 5a and 5b are removed therefrom, to obtain entire region 6 (see FIG. 1B) having a complex planar shape and to be subjected to processing required for drawing the pattern on the workpiece with the electron beam (see FIG. 1B).

Figure 1B:
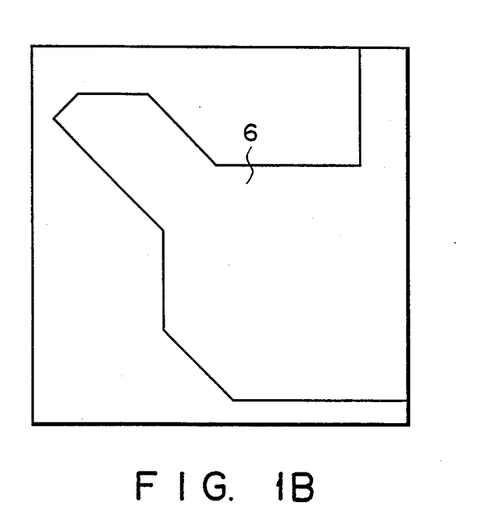
Figure 1C:
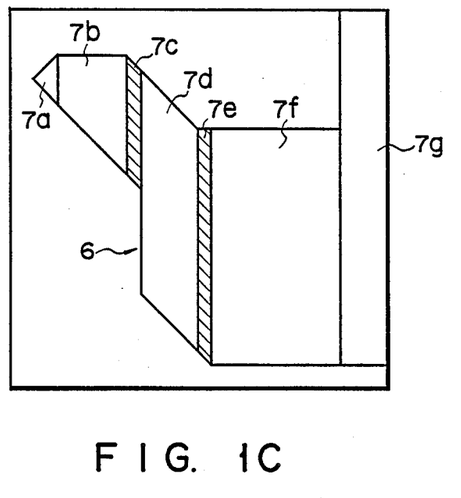
Figure 1D:
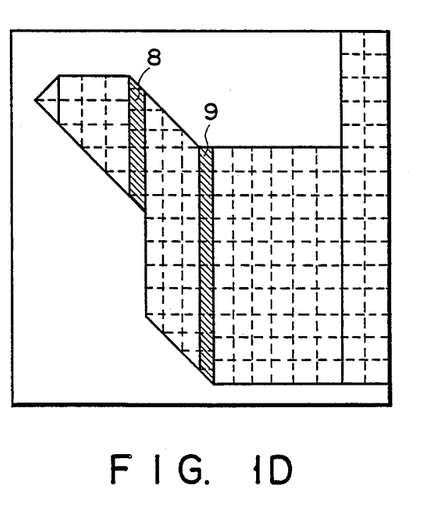

Region 6 is then divided into one set of unit figures of a simple planar shape each of which corresponds to one of the predetermined basic figures so that it can be drawn by the used pattern drawing system. Each unit figure is extracted from region 6 along either x- or y-axis, e.g., the y-axis of the workpiece support table of the pattern drawing system. In this case, lines passing the vertexes of region 6 and parallel to the y-axis are drawn, as shown in FIG. 1C, thereby dividing region 6 into unit FIGS. 7a to 7g. The graphic pattern data corresponding to the respective unit figures are stored in the internal data storage unit of the pattern drawing system. In actual pattern drawing, the graphic pattern data is read out from the storage unit in units of unit figures and decoded to obtain a final drawing pattern. In the final drawing pattern, each unit figure is further divided into minimum square regions (known as "fields") that can be processed by the beam generating section of the system. The generated electron beam is appropriately deflected and the pattern is drawn.

In the conventional example described above, when region 6 is divided into unit FIGS. (known as "frames") 7a to 7g, a too-small figure (too-small FIGS. 8 and 9 in this case) tends to occur. If the pattern is drawn leaving regions 8 and 9, the pattern drawing precision in regions 8 and 9 becomes considerably degraded. This is because of the following reason. It is very difficult to increase the beam radiation amount to a desired degree in regions 8 and 9. As a result, a pattern defect occurs and the pattern drawing quality is largely degraded. This problem is very serious in micropatterned semiconductor devices.

This conventional problem can be effectively solved by the method for drawing a desired circuit pattern using a charged particle beam to be described below in detail.

Figure 2:
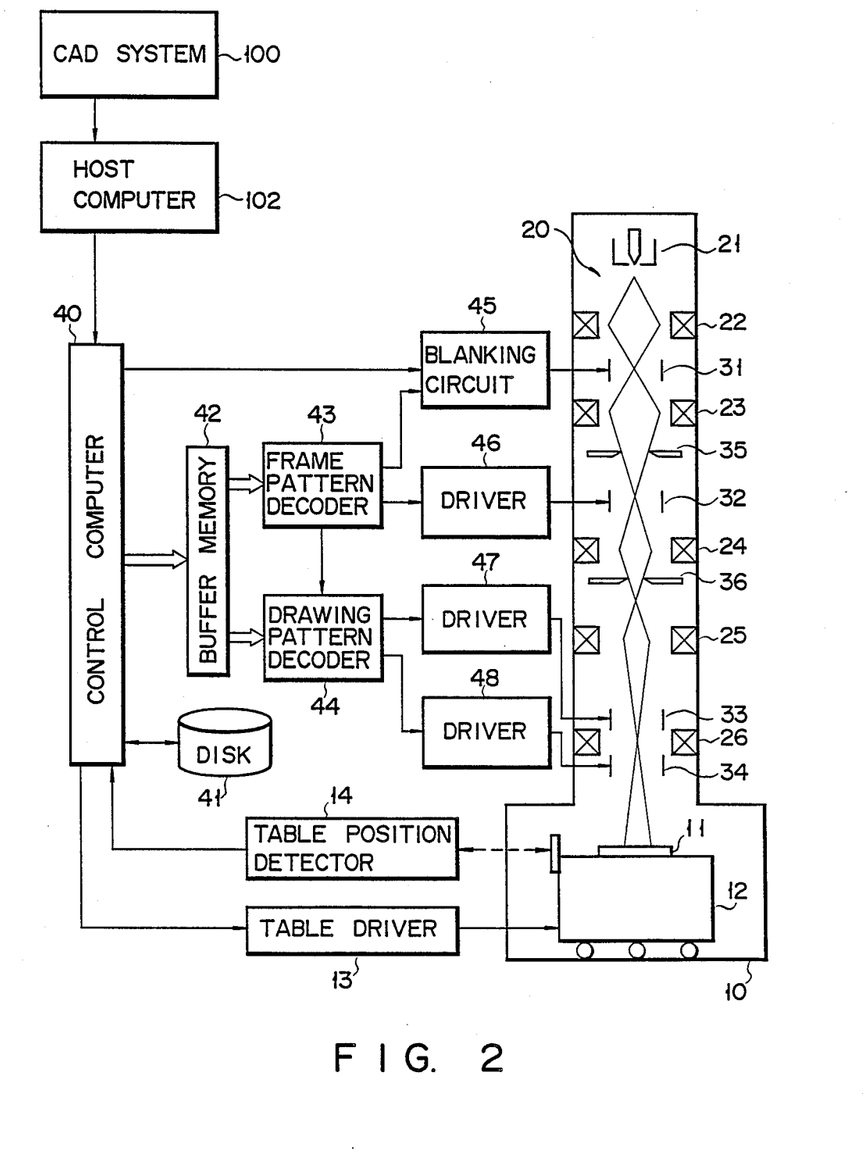
FIG. 2 is a block diagram schematically showing an overall arrangement of an electron beam pattern drawing system preferably used to practice the method for drawing a desired circuit pattern using a charged particle beam according to the present invention.

Referring to FIG. 2, the charged particle beam pattern drawing system preferably used for practicing the method for drawing a desired circuit pattern using a charged particle beam according to the present invention may be an electron beam pattern drawing system basically comprising a main body illustrated on the right side, and a control section illustrated on the left side in FIG. 2. The main body has chamber 10 defining a workpiece chamber and an electron lens barrel which projects upward from chamber 10 and which is generally designated by reference numeral "20". Chamber 10 houses horizontally movable table 12 (also referred to as an "X-Y stage") for supporting object or workpiece 11 such as a semiconductor wafer and a mask on which a pattern is to be drawn using an electron beam. Table 12 is driven by table driver 13 including an electric motor (not shown) and freely moves in the X and Y directions in order to adjust the pattern drawing position of workpiece 11. The current position of table 12 can be optically detected in a real-time manner by table position detector 14 including a laser interferometer based on an optical measuring technique known to a person skilled in the art.

Electron gun 21 is fixed at a highest portion of electron lens barrel 20, which has various types of electron lenses vertically, sequentially arranged along its extending direction. These lenses include radiation lens 22, projection lens 23, reduction lens 24, rotating lens 25, and projection lens 26. Barrel 20 further has blanking deflector 31, beam shape/spot size control electrode 32, main deflector 33 for controlling beam scanning, and subdeflector 34 for determining the beam exposure position of workpiece 11, which are arranged along lenses 22 to 26 as shown in FIG. 2. An electron beam generated by electron gun 21 passes first and second beam generating apertures 35 and 36 and becomes a pattern drawing beam consisting of rectangular and rectangular equilateral triangular beams. Main deflector 33 deflects the pattern drawing beam onto a desired field region defined on workpiece 11. Subdeflector 34 deflects the pattern drawing beam onto a desired portion within the field region to perform fine beam positioning. With such an arrangement of barrel 20, an electron beam emitted by electron gun 21 is guided into chamber 10 along a track as shown in FIG. 2 and focused on a desired surface region of the workpiece placed on movable table 12.

The control section includes system control computer 40, which is connected to external computer-aided design (CAD) system 100 through host computer 102. The operator may design the circuit pattern of a semiconductor microdevice, e.g., an LSI, by utilizing CAD system 100. CAD system 100 generates drawing pattern data representing circuit pattern information to be drawn on workpiece 11 obtained by CAD design. The drawing pattern data is transferred to control computer 40 of the electron beam pattern drawing system through host computer 102, which then performs data adaptation for converting the CAD design data into data of a format that can be processed by the electron beam pattern drawing system. Host computer 102 also performs contour extraction which was described with reference to FIG. 1C.

Magnetic disk unit 41 is connected to control computer 40. Disk unit 41 serves to store drawing pattern data of a semiconductor microdevice such as an LSI which is generated by CAD system 100. The drawing pattern data read out under the control of computer 40 is transferred to buffer memory 42 normally called a "pattern memory", discriminated in units of above-described frame regions, and temporarily stored therein.

Pattern memory 42 is connected to two decoders, i.e., frame pattern decoder 43 and drawing pattern decoder 44. Decoders 43 and 44 analyze (1) data defining the position on workpiece 11 where the pattern is to be drawn using the electron beam; and (2) pattern information in units of frame regions comprising data representing basic figures, such as a rectangle, a trapezoid, and a parallelogram, that are registered in advance for unit figures obtained by dividing a circuit pattern to be drawn. The analysis result obtained by decoder 43 is supplied to blanking circuit 45 and electrode driver 46. The analysis result obtained by decoder 44 is supplied to main deflector driver 47 and subdeflector driver 48.

Frame pattern decoder 43 generates pattern drawing unit figure information representing unit figures, which are obtained by dividing the drawing circuit pattern, based on the circuit pattern to be drawn and in accordance with a manner to be described later in detail. Blanking data is generated based on the pattern drawing unit figure information and supplied to blanking circuit 45. Blanking circuit 45 generates data defining a desired spot size and shape of the electron beam (called "beam dimension data"). The beam dimension data is supplied to beam shape/spot size control electrode 32 through driver 46. Thus, the electron beam is controlled by control electrode 32 to have the designated spot size and shape.

Drawing pattern decoder 44 generates positioning data of the subfield on workpiece 11 based on the drawing circuit pattern data. The subfield positioning data is supplied to main deflector driver 47. In response to the subfield positioning data, driver 47 generates an appropriate drive control signal for main deflector 33. The drive control signal is supplied to deflector 33: the electron beam traveling in electron lens barrel 20 is deflected and scanned to radiate the designated subfield on workpiece 11. Decoder 44 further generates an appropriate drive control signal for subdeflector 34 based on the drawing pattern unit figure information generated by frame pattern decoder 43. The drive control signal is supplied to deflector 34: the electron beam is deflected and scanned to draw a desired detailed circuit pattern within the designated subfield on workpiece 11.

A process for generating drawing pattern data performed by the electron beam pattern drawing system having the above arrangement will be described also with reference to FIGS. 3A to 3H.

LSI circuit design pattern data generated by CAD system 100 is transferred through host computer 102 to the electron beam pattern drawing system. At this time, computer 102 performs the above-described data adaptation. The data processing process of the present invention will be described by citing the example of the design pattern described above again. Contour extraction is performed by computer 102, and entire region 6 having a complex polygonal planar shape to be drawn on a workpiece using an electron beam, as shown in FIG. 1B, is generated. The graphic pattern is first divided into unit FIGS. 7a to 7b by dividing lines that pass the vertexes of FIG. 6 and parallel to either the x- or y-axis, e.g., the y-axis of the workpiece support table of the pattern drawing system, as shown in FIG. 1C. The graphic patterns corresponding to the respective unit figures correspond to the basic figures having several simple rectangular shapes that are registered in advance, as described above.

First process for too-small figure elimination

Figure 3A:
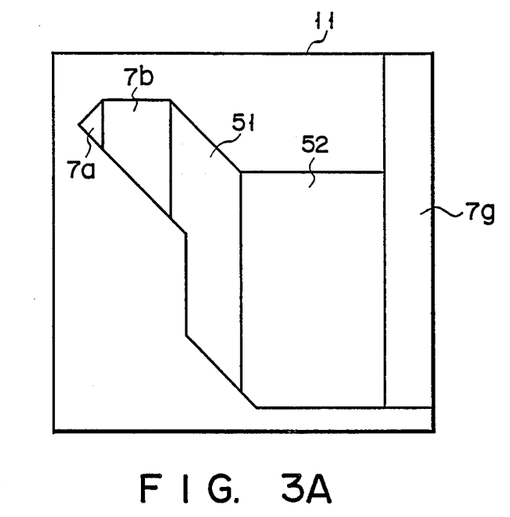
FIGS. 3A to 3H are diagrams schematically showing unit figures sequentially created in the major process of dividing the input drawing pattern into several pattern drawing unit figures in accordance with the method of the present invention.

In the example shown in FIG. 1C, two too-small FIGS. 7c and 7e are present among seven divided unit FIGS. 7a to 7g. In this case, according to the present invention, figure merging is performed so that each too-small figure is merged with at least one unit figure adjacent to it to define a new expanded unit figure. More specifically, too-small FIG. 7c is merged with right unit FIG. 7d to generate expanded unit FIG. 51 shown in FIG. 3A. Too-small FIG. 7e is merged with left unit FIG. 7f to generate polygonal expanded unit FIG. 52 shown in FIG. 3A. As a result, as shown in FIG. 3A, five unit FIGS. 7a, 7b, 7g, 51, and 52 can be obtained.

Expanded unit FIGS. 51 and 52 are subsequently subjected to region division. In region division, parallel dividing lines along an axial direction different from that used for the previous division, i.e., along the x-axis in this case, are used. Parallel dividing lines (indicated by broken lines in FIG. 3B) that pass the vertexes of FIG. 51 and parallel to the x-axis are drawn in FIG. 51. As a result, FIG. 51 is subdivided into small FIGS. 51a to 51e. A single dividing line is drawn in FIG. 52 to subdivide it into small FIGS. 52a and 52b.

Figure 3B:
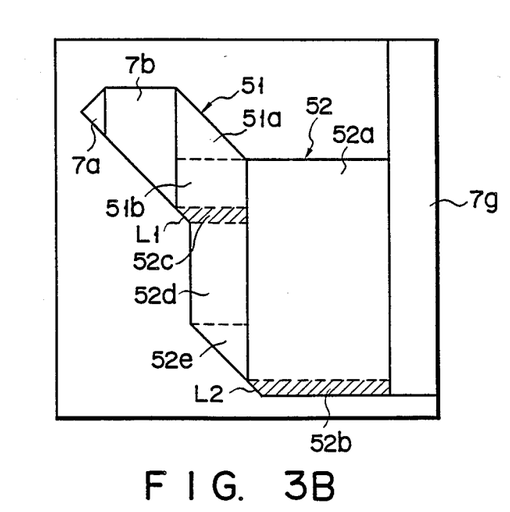

In the example of FIG. 3B, too-small FIGS. 51c and 52b respectively having too-small sides L1 and L2 remain even after execution of subdivision described above. The presence of a too-small figure even after first region division using the dividing lines parallel to the y-axis and second region division (subdivision) using the dividing lines parallel to the x-axis is due to the fact that a subdivided, minimum unit figure (e.g., unit FIG. 51 in FIG. 3A) has a too-small side (e.g., too-small side L1) which is aslant with respect to the x- and y-axes. When a slant side is a too-small side, both the dividing lines passing the two ends of the slant side and extending along the x- or y-axis define a too-small region. In such a case, according to the present invention, it is determined that the first division for too-small figure elimination including subdivision in the x-axis described above is not effective, and subsequently the second process is performed.

Second process for too-small figure elimination

Figure 3C:
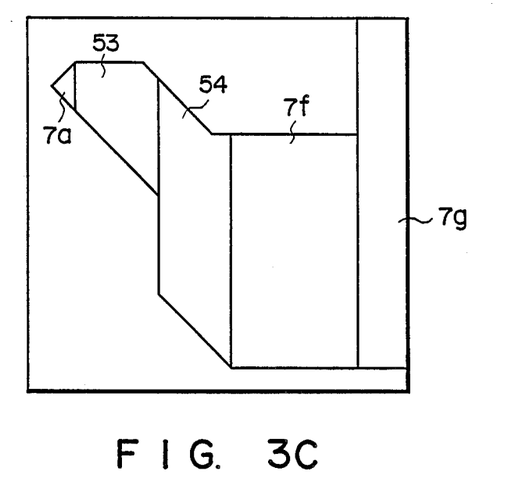
Figure 3D:
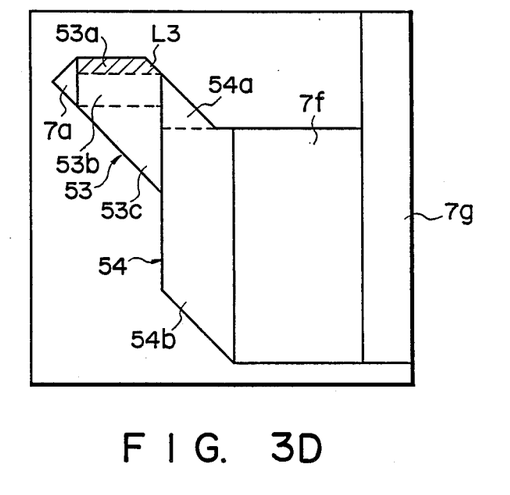
Figure 3E:
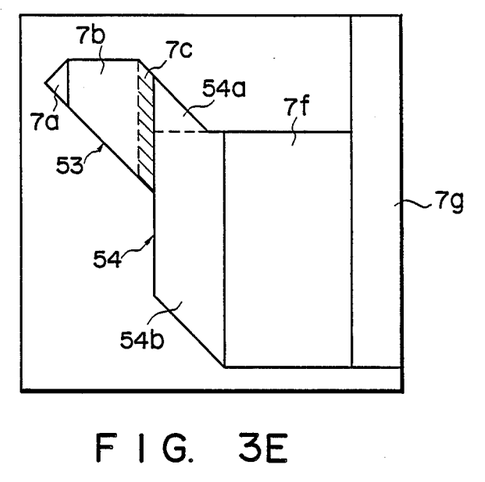
Figure 3F:
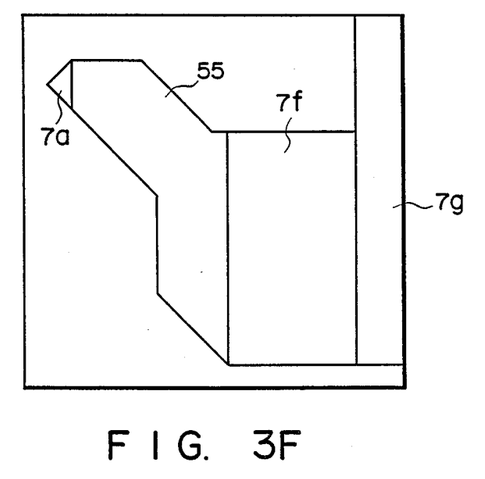
Figure 3G:
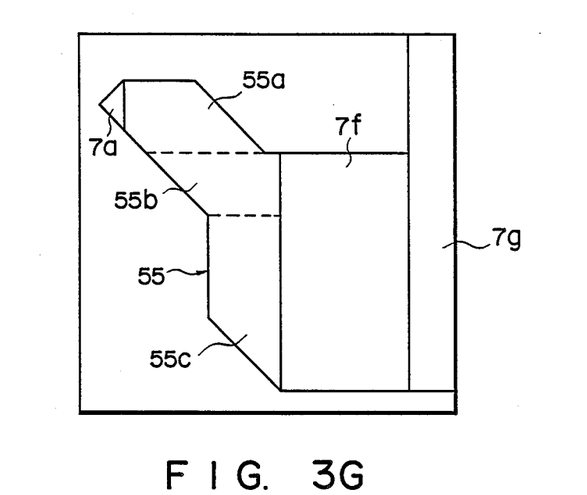
Figure 3H:
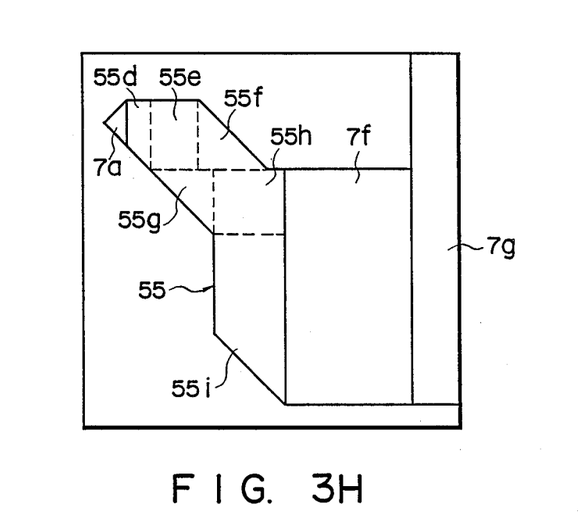

In the second process, each of too-small FIGS. 7c and 7e (see FIG. 1C) is merged with an adjacent figure. For example, FIG. 7c is merged with adjacent unit FIG. 7b on its left side, and new expanded unit figure 53 is defined, as shown in FIG. 3C. FIG. 7e is merged with adjacent unit FIG. 7d on its left side, and new expanded unit FIG. 54 is defined. As a result, original unit FIG. 7f is recovered to obtain five unit FIGS. 7a, 7f, 7g, 53, and 54. Newly formed unit FIGS. 53 and 54 are subjected to subdivision using subdividing lines parallel to the x-axis. As a result, as shown in FIG. 3D, FIG. 53 is subdivided into three small regions 53a to 53c, and FIG. 54 is subdivided into two small regions 54a and 54b. No too-small figure is present in FIG. 54, and thus subdivision of figure 54 for the purpose of too-small figure elimination is succeeded. However, since too-small FIG. 53a having too-small side L3 is present in FIG. 53, subdivision of FIG. 53 for the purpose of too-small figure elimination failed. In this case, according to the present invention, only the failed figure, i.e., unit FIG. 53 is subjected to the subsequent third process. Third process for too-small figure elimination In the third process, first, FIG. 53 is returned to original unit figures, i.e., too-small FIG. 7c and adjacent unit FIG. 7b on its left side. As a result, seven unit FIGS. 7a, 7b, 7c, 7f, 7g, 54a, and 54b are obtained, as shown in FIG. 3E. Subsequently, too-small FIG. 7c is merged with adjacent unit figures, i.e., FIGS. 7a, 54a and 54b on its right and left sides to form new expanded unit FIG. 55 in FIG. 3F. FIG. 55 is subdivided into three small regions 55a, 55b, and 55c with subdividing lines passing its vertexes and parallel to the x-axis, as shown in FIG. 3G. Small regions 55a, 55b, and 55c are further subdivided into a plurality of small regions 55d to 55i with subdividing lines passing their vertexes and parallel to the y-axis. No too-small figure is present in regions 55d to 55i. Therefore, subdivision of regions 55d to 55i for the purpose of too-small figure elimination is succeeded. Division of an LSI circuit pattern, which is to be drawn on workpiece 11, into unit figures is completed, and figures 7a, 7f, 7g, and 55d to 55i are determined as the unit figures that are divided most optimally.

Figure 4:
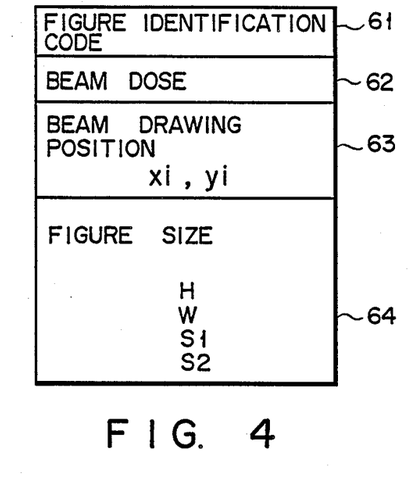
FIG. 4 is a schematic diagram of the data format of pattern drawing information temporarily stored in a magnetic disk unit of the electron beam pattern drawing system after the unit figures of the input pattern are optimally determined.
Figure 5:
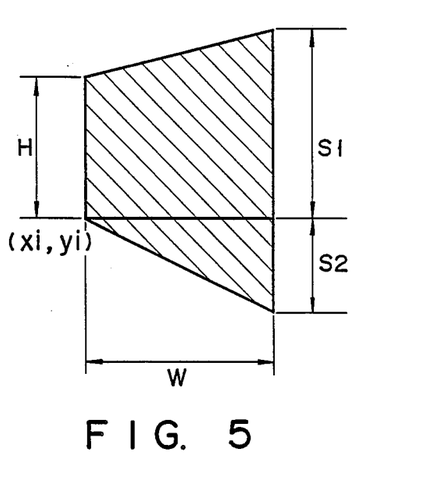
FIG. 5 is an enlarged diagram of a pattern drawing unit figure having a trapezoidal planar shape and shows major sides used for defining its shape and size.

After the most optimally divided unit figures of the LSI circuit pattern are determined, the pattern drawing information including information about these unit figures is temporarily stored in magnetic disk unit 41. The data format of the pattern drawing information in this case is shown in FIG. 4. Code 61 representing the type of figure is added to the pattern drawing information format of each unit figure. Code 61 is binary data designating the correspondence between a unit figure and a basic figure. For example, when the corresponding unit figure is a trapezoid, code 61 is data "11". The pattern drawing information format of each unit figure further includes data 62 designating the beam radiation amount, data 63 indicating a practical electron beam drawing position on workpiece 11, and data 64 defining the shape and size of the unit figure. A practical electron beam drawing position on workpiece 11 is indicated by, e.g., a point (xi, yi) on the X-Y coordinate system of table 12. The shape and size of the unit figure are determined by defining the lengths of the major sides measured from the drawing point (xi, yi). For example, when the unit figure is a trapezoid, the lengths of its first and second parallel sides (major and minor sides of the trapezoid) and a distance between them are obtained by measuring lengths H, S1, S2, and W of line segments respectively starting from a vertex point (xi, yi) that defines the drawing position. As a result, the shape of the unit figure is uniquely determined.

Figure 6:
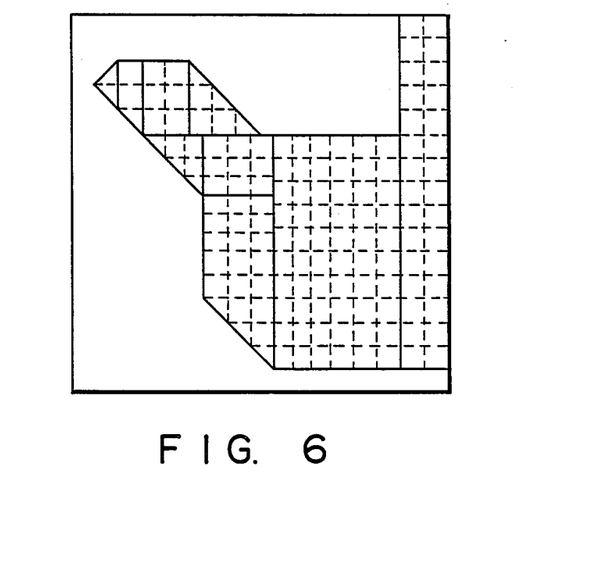
FIG. 6 is a schematic diagram of subfield regions (respectively corresponding to the one-shot regions used when electron beam pattern drawing is actually executed) applied to the input graphic pattern which is optimally divided into the pattern drawing unit figures.

Square (or partially triangular square) pattern drawing unit figures respectively corresponding to the one-shot regions used when electron beam pattern drawing is actually executed are defined in the LSI circuit pattern on workpiece 11 in units of unit figures as indicated by the region hatched with broken lines in FIG. 6 based on the drawing pattern data described above. These unit figures include no too-small side. Therefore, each unit figure can be subjected to sufficient exposure with the electron beam, and irradiation amounts of the electron beam patterns of the figures can be set uniform. Therefore, high-precision electron beam pattern drawing can be expected. This results in a considerable advantage in the manufacture of microfabricated semiconductor devices having a very high packing density.

Although the invention has been described with reference to a specific embodiment, it shall be understood by those skilled in the art that numerous modifications may be made that are within the spirit and scope of the inventive contribution. For example, the too small fig-ure elimination technique for pattern drawing of the present invention can be freely applied to various types of charged particle beam pattern drawing systems including an ion beam pattern drawing system. The beam pattern drawing method itself is not limited to the above-described two-step deflection type wherein the main/sub deflections are combined, but can be a single step deflection.

When a too-small figure cannot be completely excluded even by executing the one- to three-step too small figure elimination processes, at least one condition is selected from three conditions of the total area of the too-small figures is minimum, the number of too-small figures is minimum, and the total number of figures is minimum, and a case of figure division that satisfies the selected condition most preferably is selected from figure divisions of FIGS. 1C, 3B, 3D, and 3H.

What is claimed is:

1. A method for determining unit figures in a circuit pattern to be exposed using a charged particle beam, said circuit pattern having a figure of a polygonal planar shape and vertexes, said method comprising the steps of:

dividing said figure of said circuit pattern into first unit figures by parallel line segments extending from said vertexes thereof in a first reference direction, each of said first unit figures corresponding to one of reference figures including a rectangle, a trapezoid, and a parallelogram;

detecting a first too-small figure having at least one side shorter than a minimum allowable side length;

merging new said first too-small figure with a certain unit figure adjacent thereto, thus defining a first expanded figure, the remaining unit figure or figures of said first unit figures being kept unchanged during this process; and dividing said expanded figure into second unit figures by parallel line segments extending from vertexes thereof in a second reference direction substantially perpendicular to the first reference direction, said second unit figures corresponding to said reference figures.

2. The method according to claim 1, further comprising the steps of:

cancelling, when a second too-small figure is included in said second unit figures, said first expanded figure and merging said first too-small figure with another of said first unit figures that is adjacent thereto, thereby defining a second expanded figure;

dividing said second expanded figure into third unit figures by parallel line segments extending from vertexes thereof in the second reference direction, said third unit figures corresponding to said reference figures, thereby generating pattern drawing information.

3. The method according to claim 2, wherein said method is applied to a computer-controlled charged particle beam pattern drawing apparatus which has a data storage unit and which draws a desired circuit pattern on a workpiece by deflecting a charged particle beam, said pattern drawing information being stored in said data storage unit.

4. A method, applied to a computer-controlled charged particle beam pattern drawing system which has a data storage unit and which draws a desired circuit pattern on a workpiece by deflecting a charged particle beam, for determining unit figures in a figure of a circuit pattern of a semiconductor device which is externally generated, said figure having a polygonal planar shape and vertexes, said method comprising the steps of:

(a) dividing said figure of said circuit pattern into first unit figures by parallel line segments extending from said vertexes thereof in a first reference direction, each of said first unit figures corresponding to one of reference figures including a rectangle, a trapezoid, and a parallelogram;

(b) detecting in said first unit figures a first too-small figure having at least one side shorter than a minimum allowable side length, a side shorter than which results in an insufficient beam exposure on said workpiece when beam pattern drawing is performed using said charged particle beam pattern drawing system;

(c) merging said first too-small figure with a certain unit figure adjacent thereto, thus defining a first expanded figure, the remaining unit figure or figures of said first unit figures being kept unchanged during this process;

(d) dividing said expanded figure into second unit figures by parallel line segments extending from vertexes thereof in a second reference direction perpendicular to the first reference direction, said second unit figures corresponding to said reference figures;

(e) canceling, when a second too-small figure is included in said second unit figures, said first expanded figure and merging said first too-small figure with another of said first unit figures that is adjacent thereto, thereby defining a second expanded figure; and (f) dividing said second expanded figure into third unit figures by parallel line segments extending from vertexes thereof in the second reference direction, said third unit figures corresponding to said reference figures, thereby generating pattern drawing information, said pattern drawing information being stored in said data storage unit.

5. The method according to claim 4, wherein, when a third too-small figure remains in said third unit figures of said second expanded figure, said second expanded figure is canceled, said first too-small figure is merged with certain and other ones of said first unit figures simultaneously, thereby defining a third expanded figure, said third expanded figure is subjected to region subdivision using line segments extending in said first and second reference directions so that updated pattern drawing information is generated, and said information is stored in said data storage unit.

6. The method according to claim 5, wherein said certain and other unit figures include one of said first unit figures which is adjacent to said first too-small figure on both sides thereof.

7. The method according to claim 5, wherein said third expanded figure is first divided using parallel line segments extending in one of said first and second reference directions, and the divided third expanded figures are subdivided using parallel line segments extending in the remaining one of said first and second reference directions.

* * * * *